United States Patent
Kawaguchi et al.

(10) Patent No.: US 10,666,002 B2
(45) Date of Patent: May 26, 2020

(54) WIRING HARNESS CONNECTING STRUCTURE FOR HOUSED CIRCUIT ASSEMBLY

(71) Applicant: Sumitomo Wiring Systems, Ltd., Yokkaichi, Mie (JP)

(72) Inventors: Kiyofumi Kawaguchi, Mie (JP); Maiko Oda, Mie (JP); Takumi Ejima, Mie (JP); Toshifumi Suzuki, Mie (JP); Yoshikazu Obara, Mie (JP); Yuki Wada, Mie (JP)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 0 days.

(21) Appl. No.: 16/160,409

(22) Filed: Oct. 15, 2018

(65) Prior Publication Data
US 2019/0115703 A1 Apr. 18, 2019

(30) Foreign Application Priority Data
Oct. 16, 2017 (JP) .................................. 2017-200532

(51) Int. Cl.
*H01R 25/00* (2006.01)
*H02G 3/22* (2006.01)
(Continued)

(52) U.S. Cl.
CPC ......... *H01R 25/003* (2013.01); *H01B 7/0045* (2013.01); *H01M 2/20* (2013.01); *H01M 10/4257* (2013.01); *H01R 13/405* (2013.01); *H01R 13/502* (2013.01); *H01R 13/6215* (2013.01); *H01R 13/6315* (2013.01); *H01R 13/6461* (2013.01); *H01R 25/006* (2013.01); *H02G 3/083* (2013.01); *H02G 3/22* (2013.01); *H02G 15/013* (2013.01); *H05K 7/00* (2013.01); *B60R 16/0215* (2013.01); *H01R 13/5219* (2013.01); *H01R 2201/26* (2013.01)

(58) Field of Classification Search
CPC ...... H01R 25/003; H01B 7/0045; H01M 2/20
See application file for complete search history.

(56) References Cited

U.S. PATENT DOCUMENTS 5,877,944 A * 3/1999 Onizuka ................ H01H 85/20
361/644
6,008,634 A * 12/1999 Murofushi ........... G01R 15/202
324/117 H
(Continued)

*Primary Examiner* — Daniel P Wicklund
*Assistant Examiner* — Christopher L Augustin
(74) *Attorney, Agent, or Firm* — Honigman LLP

(57) ABSTRACT

A novel wire harness connecting structure for a housed circuit assembly is provided. The connecting structure is able to electrically connect a wire harness and a circuit assembly housed in a housing to each other, using a small number of parts, with high space efficiency. The wire harness connecting structure for housed circuit assemblies is used to electrically connect wire harnesses to circuit assemblies housed in a housing, wherein through holes are provided in a wall of the housing, circuit assembly connectors that are provided in the circuit assemblies face the through holes, and harness end connectors that are provided at ends of the wire harnesses are configured to be inserted into the through holes of the housing and to be connected to the circuit assembly connectors of the circuit assemblies.

7 Claims, 5 Drawing Sheets

(51) Int. Cl.
  *H01B 7/00*       (2006.01)
  *H02G 15/013*     (2006.01)
  *H01R 13/6461*    (2011.01)
  *H01R 13/631*     (2006.01)
  *H01R 13/502*     (2006.01)
  *H01R 13/405*     (2006.01)
  *H01R 13/621*     (2006.01)
  *H01M 10/42*      (2006.01)
  *H01M 2/20*       (2006.01)
  *H02G 3/08*       (2006.01)
  *H05K 7/00*       (2006.01)
  *B60R 16/02*      (2006.01)
  *H01R 13/52*      (2006.01)

(56) References Cited

U.S. PATENT DOCUMENTS

| | | | | |
|---|---|---|---|---|
| 10,090,613 B2* | 10/2018 | Choi | .................... | H01R 13/501 |
| 2001/0018294 A1* | 8/2001 | Kameyama | ............ | H01R 31/06 |
| | | | | 439/654 |
| 2005/0090132 A1* | 4/2005 | Miyazaki | ......... | H01R 13/62905 |
| | | | | 439/130 |
| 2012/0200978 A1* | 8/2012 | Miller | .................... | H01Q 1/50 |
| | | | | 361/118 |
| 2014/0072835 A1 | 3/2014 | Tsujimura et al. | | |
| 2014/0079977 A1* | 3/2014 | Tsujimura | ........... | H01M 2/1077 |
| | | | | 429/120 |
| 2014/0198467 A1* | 7/2014 | Shi | .................... | B60R 16/0238 |
| | | | | 361/752 |
| 2016/0211626 A1* | 7/2016 | Long | .................... | H01R 12/721 |
| 2018/0375256 A1* | 12/2018 | Peterson | ................ | H01R 13/60 |
| 2019/0081292 A1* | 3/2019 | Shimizu | .............. | H01M 2/1077 |

\* cited by examiner

WIRING HARNESS CONNECTING STRUCTURE FOR HOUSED CIRCUIT ASSEMBLY

CROSS-REFERENCE TO RELATED APPLICATIONS

This application claims priority of Japanese Patent Application No. JP2017-200532 filed Oct. 16, 2017.

TECHNICAL FIELD

The present disclosure relates to a wire harness connecting structure for a housed circuit assembly, the structure being used to electrically connect a wire harness to a circuit assembly housed in a housing.

BACKGROUND

Conventionally, a circuit assembly such as a junction box that uses a relay circuit to supply, block, or distribute power, for example, is employed in an electrical component system in an automobile, and is fixed at an appropriate position of an automobile so that it can be used. Also, as disclosed in JP 2012-243449A, electric vehicles, hybrid cars, plug-in hybrid cars, and the like in recent years employ a configuration in which a junction box is housed in a housing of a battery pack together with a battery module, a battery control system, and so on.

Here, as disclosed in JP 2012-243449A, such a junction box housed in a housing and an external wire harness are connected to each other by mating a harness end connector, which is provided at an end of the wire harness, to a housing connector, which is provided on a peripheral wall of the housing, and electrically connecting the housing connector and the junction box in the housing to each other, using a coated electrical wire or a bus bar.

However, such a conventional structure for connecting a wire harness to a circuit assembly in a housing involves a large number of parts that are interposed between the wire harness and the circuit assembly, and therefore a conventional structure needs a large space so that the interposed parts can be housed and arranged therein, and thus faces limitations in satisfying the need for saving space. In addition, an increase in the number of work steps is inevitable due to the number of parts being large, which leads to lower production efficiency.

SUMMARY

The present disclosure has been made in view of the above-described situation, and an aim thereof is to provide a novel wire harness connecting structure for a housed circuit assembly, the structure being able to electrically connect an external wire harness and a circuit assembly housed in a housing to each other, using a small number of parts, with high space efficiency.

A first aspect of the present disclosure is a wire harness connecting structure for a housed circuit assembly, the structure being used to electrically connect a wire harness to a circuit assembly housed in a circuit assembly housing, wherein a through hole is provided in a wall of the circuit assembly housing, a circuit assembly connector that is provided in the circuit assembly faces the through hole, and a harness end connector that is provided at an end of the wire harness is configured to be inserted into the through hole of the circuit assembly housing and to be connected to the circuit assembly connector of the circuit assembly.

According to this aspect, a circuit assembly connector is provided in the circuit assembly that is housed in a circuit assembly housing, and the circuit assembly connector is provided so as to face the through hole. A harness end connector that is provided at an end of an external wire harness is configured to be inserted into the through hole of the circuit assembly housing and to be connected to the circuit assembly connector of the circuit assembly. Thus, it is possible to eliminate the need for parts that are necessary for a conventional structure, namely, a housing connector provided on a wall of a circuit assembly housing, and a wire harness and a bus bar that electrically connect the housing connector and a circuit assembly to each other. As a result, it is possible to reduce the number of parts, and accordingly reduce the number of work steps. Also, it is possible to save space that is needed to connect the circuit assembly and the wire harness to each other.

A second aspect of the present disclosure is the wire harness connecting structure according to the first aspect, wherein the circuit assembly connector and the harness end connector are each provided with a connector housing and a connection terminal that is held by the connector housing, and at least one of the circuit assembly connector and the harness end connector has a floating structure in which the connection terminal and a housing movable portion that encloses the connection terminal are held so as to be displaceable relative to a body of the connector housing.

According to this aspect, the harness terminal connector of the wire harness is configured to be inserted into the through hole penetrating through the wall of the circuit assembly housing, and to be connected to the circuit assembly connector of the circuit assembly arranged in the circuit assembly housing. Therefore, dimensional tolerances accumulate, and there is the risk of the positioning of the connectors being difficult. In view of this problem, at least one of the circuit assembly connector and the harness end connector is configured to have a floating structure, so that dimensional tolerances can be absorbed and the problem of concern can be advantageously solved.

A third aspect of the present disclosure is the wire harness connecting structure according to the second aspect, wherein a positioning mechanism is provided between respective surfaces that face each other of the circuit assembly housing and the circuit assembly, the positioning mechanism including a positioning protrusion and a positioning cavity that are configured to be fitted to each other, the positioning protrusion being provided on one of the circuit assembly housing and the circuit assembly, the positioning cavity being provided in the other of the circuit assembly housing and the circuit assembly, and a dimensional tolerance regarding a gap between respective surfaces that face each other of the positioning protrusion and the positioning cavity is smaller than the length of displacement of the circuit assembly terminal in the floating structure, relative to the connector housing.

According to this aspect, the connector that has a floating structure and the positioning mechanism including the positioning protrusion and cavity between the respective surfaces of the circuit assembly housing and the circuit assembly are employed in combination. Therefore, it is possible to reduce the dimensional tolerance regarding the gap of the positioning mechanism so as to be smaller than the length of displacement of the floating structure. As a result, it is possible to further reduce variation in the position of the circuit assembly in the circuit assembly housing, and it is possible to advantageously reduce or eliminate the possibility of displacement occurring between the through hole of the circuit assembly housing and the connector of the circuit assembly.

A fourth aspect of the present disclosure is the wire harness connecting structure according to any one of the first to third aspects, wherein the circuit assembly housing is made of metal, the circuit assembly constitutes a junction box that is configured to switch to a connected state and to a disconnected state using a relay circuit, and the junction box and a battery module that is connected to the junction box are housed in the circuit assembly housing and thus a battery pack is formed.

According to this aspect, a junction box is housed in a battery pack whose housing is made of metal. Therefore, it is possible to shorten a high-voltage electrical wire that connects them, and it is possible to mitigate or solve the problem of noise. Furthermore, it is possible to insert the harness end connector of the wire harness into the through hole in the circuit assembly housing and directly connect the harness end connector to the circuit assembly connector provided in the junction box in the metal housing. Therefore, it is also possible to reduce the number of parts, for example. Furthermore, using a combination with the second or third aspect, in a case where the harness end connector is inserted into the through hole of the metal housing, and is connected to the connector of the junction box in the housing, it is also possible to advantageously mitigate or solve the issue of difficulty in connecting the connectors due to tolerance being accumulated. Therefore, it is possible to constantly realize an improvement in manufacturability of the battery pack with the configuration according to the present aspect.

A fifth aspect of the present disclosure is the wire harness connecting structure according to any one of the first to fourth aspects, wherein the outer circumferential surface of the connector housing of the harness end connector of the wire harness is configured to be press-fitted to an inner circumferential edge portion of the through hole of the circuit assembly housing with a seal member therebetween.

According to the present aspect, the outer circumferential surface of the connector housing of the harness end connector is configured to be press-fitted to the inner circumferential edge portion of the through hole of the circuit assembly housing with a seal member therebetween. Therefore, it is possible to ensure that the through hole is waterproof as well as to absorb vibrations or the like occurring between the through hole and the connector housing.

According to the present disclosure, a circuit assembly connector is provided in a circuit assembly, and the connector faces a through hole of a circuit assembly housing. A harness end connector that is provided at an end of the wire harness is configured to be inserted into the through hole, and to be directly connected to the connector of the circuit assembly. Thus, it is possible to eliminate the need for parts that are necessary for a conventional structure, namely, a housing connector, and a coated wire and a bus bar that electrically connect the housing connector and a circuit assembly to each other. Therefore, it is possible to reduce the number of parts, and accordingly reduce the number of work steps, and it is possible to save space that is needed to connect the circuit assembly and the wire harness to each other.

DETAILED DESCRIPTION OF PREFERRED EMBODIMENTS

Figure 1:
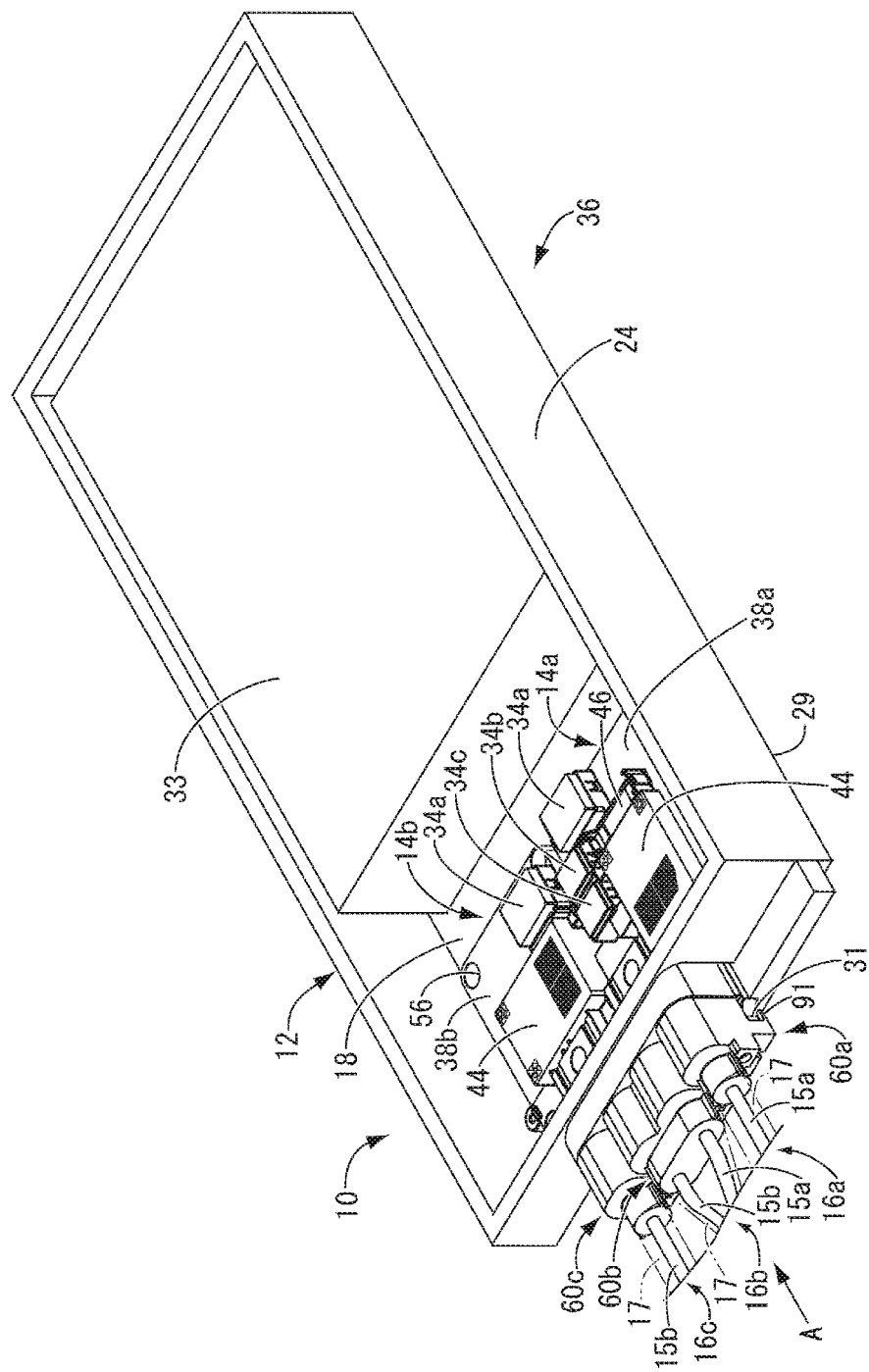
FIG. 1 is a perspective view of a wire harness connecting structure for housed circuit assemblies, which is an embodiment of the present disclosure.

The following describes an embodiment of the present disclosure with reference to the drawings.

First, FIGS. 1 to 6 show an example in which a wire harnesses connecting structure 10 for housed circuit assemblies according to a first embodiment of the present disclosure is applied to a battery pack 36. That is, these drawings show a structure for electrically connecting wire harnesses 16a, 16b, and 16c to junction boxes 14a and 14b, which are circuit assemblies housed in a housing body 12 that constitutes a housing of the battery pack 36. In the following descriptions, "above" and "upward" refer to an upward direction in FIGS. 1 and 4 to 6, "below" and "downward" refer to a downward direction in FIGS. 1 and 4 to 6, "forward" refers to a direction to the left in FIGS. 2 and 3, and "rearward" refers to a direction to the right in FIGS. 2 and 3.

As shown in FIGS. 1 to 3 and 5, the wire harness 16a has a configuration in which a positive-side electrical wire 15a that is connected to a positive-side connection terminal 52 of a low-voltage circuit (described later) is housed in a covering member 17 that is constituted by a shield member or an insulation member, and the wire harness 16b has a configuration in which a positive-side electrical wire 15a that is connected to the positive-side connection terminal 52 of a battery module 33 (described later) and a negative-side electrical wire 15b that is connected to a negative-side connection terminal 52 of the battery module 33 are housed in a covering member 17. Also, the wire harness 16c has a configuration in which a negative-side electrical wire 15b that is connected to a negative-side connection terminal 52 of a low-voltage circuit (described later) is housed in a covering member 17.

Figure 3:
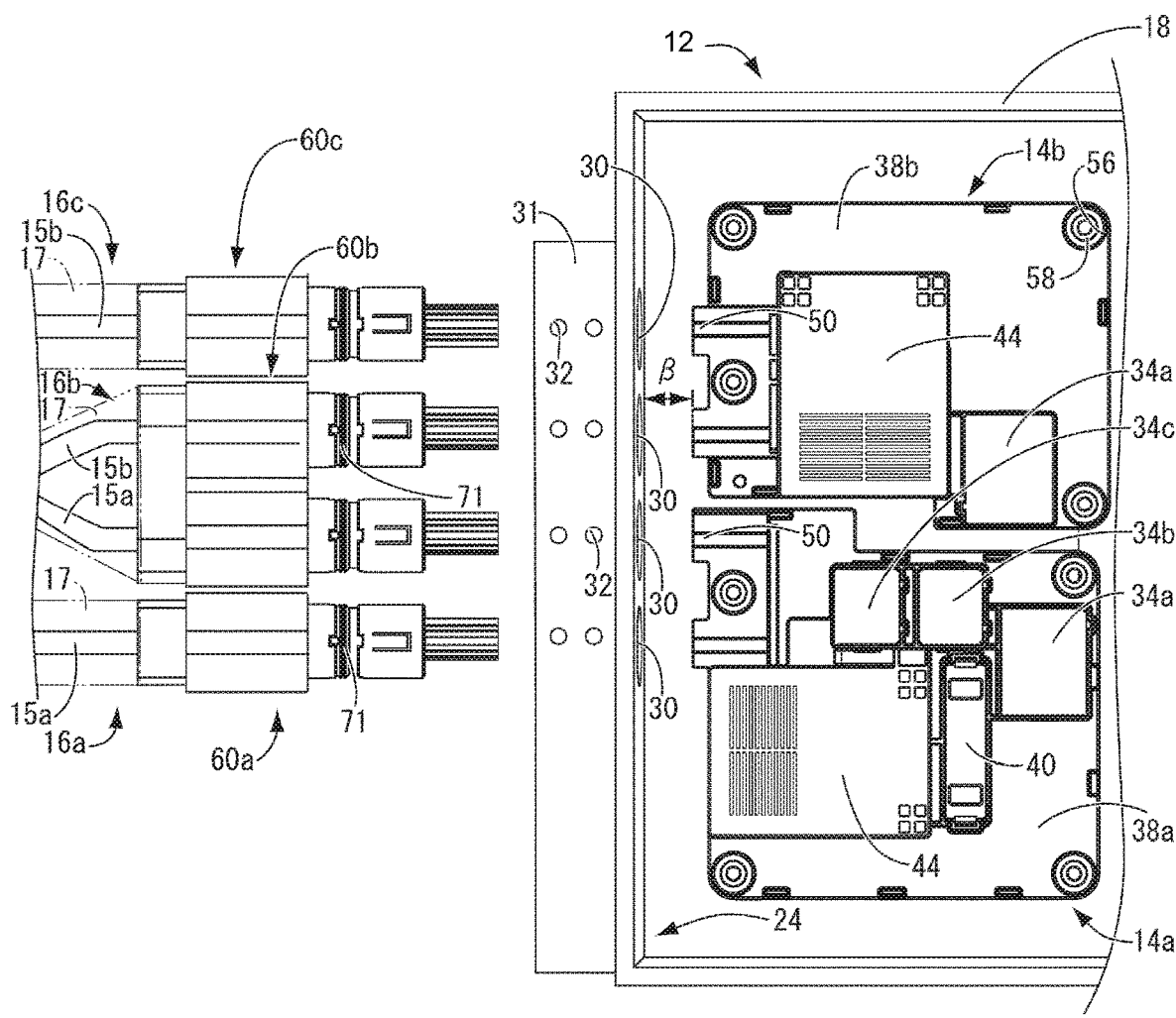
FIG. 3 is a plan view showing a state in which harness end connectors provided at ends of the wire harnesses in FIG. 2 are detached.
Figure 4:
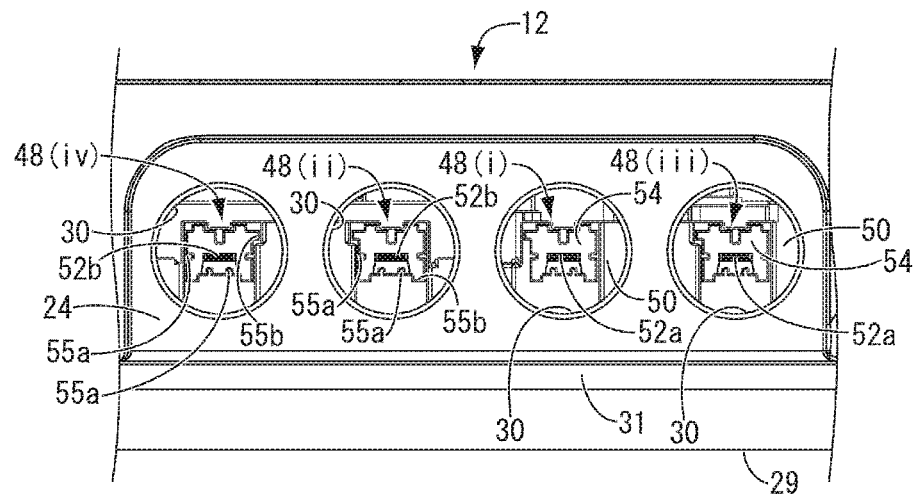
FIG. 4 is a front view of a portion of the housing shown in FIG. 1, in which the circuit assemblies are housed, and is a view in the direction indicated by an arrow "A" in FIG. 1.

As shown in FIG. 1, the housing body 12 is formed through die-casting using an aluminum alloy, for example, and substantially has a shallow box shape overall, which is substantially rectangular in plan view. The housing body 12 is fixed to and supported at a plurality of points on a vehicle body reinforcement member (not shown) located under a seat of a vehicle body, for example, using a fixing structure (not shown). Also, the housing body 12 is configured such that a housing lid (not shown), for example, can be fastened thereto using a locking structure (not shown), using bolts and nuts. In addition, as shown in FIGS. 3 and 4, a front-side portion of a peripheral wall 24 of the housing body 12 is provided with four through holes 30 that each have a substantially circular cross section, that each penetrate through the front-side portion of the peripheral wall 24 in a front-rear direction, that have the same shape, and that are separated from each other at equal intervals in the lengthwise direction of the front-side portion of the peripheral wall 24. The front-side portion of the peripheral wall 24 of the housing body 12, in which the through holes 30 are provided, is also provided with a harness end connector fixing portion 31 that is located below the through holes 30 and is higher than a bottom surface 29 of the housing body 12, has a substantially rectangular flat plate shape, and protrudes forward (see FIGS. 2 to 4). Fixing holes 32 that each have a substantially circular cross section penetrate through the harness end connector fixing portion 31 (see FIG. 3) so as to be able to hold connector housings 62a to 62c of harness end connectors 60a to 60c (described later) using bolts, for example.

As shown in FIG. 1, the housing body 12 with such a configuration houses: the two junction boxes 14a and 14b, which constitute circuit assemblies; and the battery module 33, which is constituted by an assembled battery in which lithium ion batteries, for example, are layered. Here, the two junction boxes 14a and 14b are each configured to electrically connect/disconnect the battery module 33 and the wire harness 16b to/from each other, using a relay circuit, and are connected to the battery module 33 via wires (not shown). In this way, in the present embodiment, the two junction boxes 14a and 14b and the battery module 33 are housed in the housing body 12 that constitutes a housing, and thus the battery pack 36 is formed.

Figure 5:
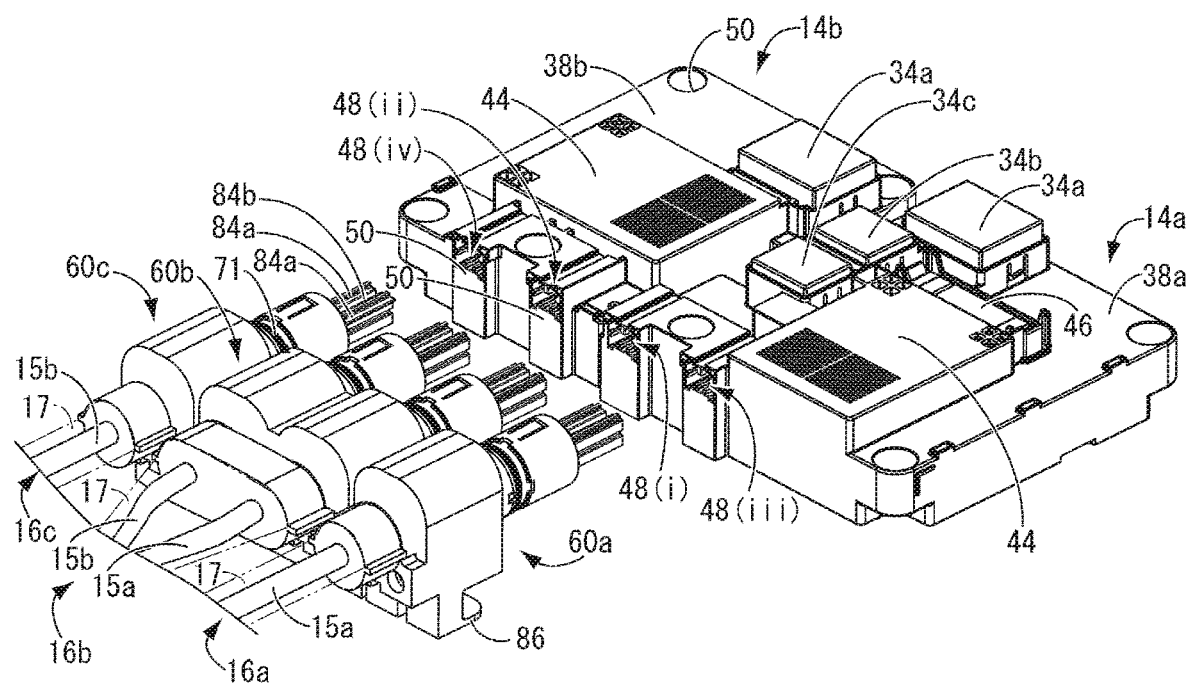
FIG. 5 is a perspective view of the harness end connectors provided at the ends of the wire harnesses, and the circuit assemblies.

FIG. 5 shows the junction boxes 14a and 14b, the wire harnesses 16a to 16c, and the harness end connectors 60a to 60c provided at the respective ends of the wire harnesses 16a to 16c. The two junction boxes 14a and 14b respectively have resin cases 38a and 38b that each have a substantially rectangular box shape overall in plan view, and internal circuits (not shown) that include a bus bar, for example, are housed and arranged in each of the resin cases 38a and 38b. The two junction boxes 14a and 14b are each provided with: a relay 34a that is connected to the positive side and the negative side of the battery module 33 and switches to an electrically connected state and an electrically disconnected state; and a battery controller 44 that makes an instruction to switch to the electrically connected state and the electrically disconnected state. In addition, the junction box 14a is provided with: a relay 34b and a resistor circuit 46 that constitute a positive-side bypass circuit for the battery module 33 to measure a current flowing on the positive side; and a relay 34c that connects/disconnects the positive side of a low-voltage circuit (not shown).

Figure 6:
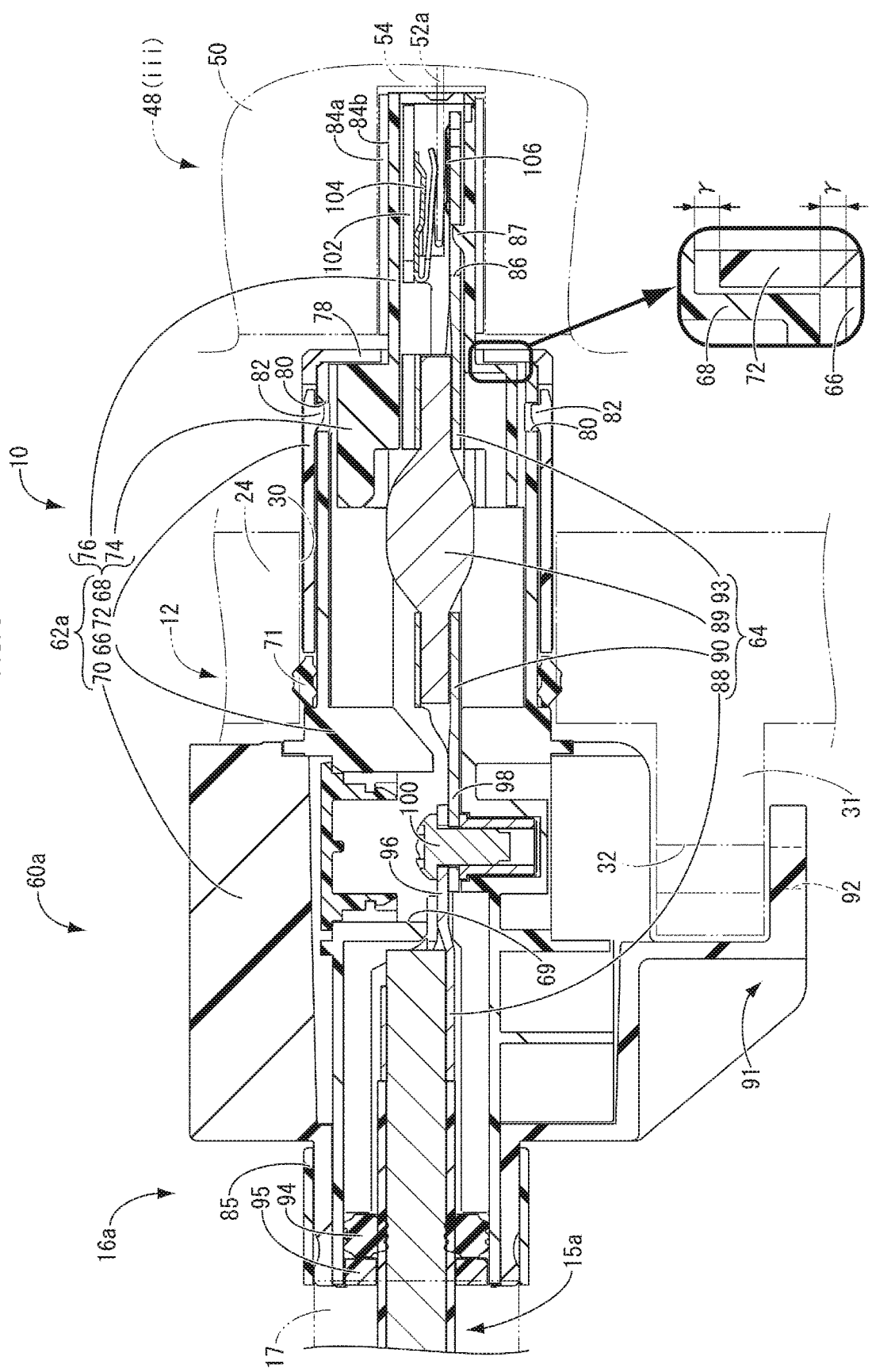
FIG. 6 is an enlarged cross-sectional view along a line VI-VI in FIG. 2.

Also, as shown in FIG. 5, first and third connectors 48(i) and 48(iii) and second and fourth connectors 48(ii) and 48(iv) are respectively provided on upper portions of the front side walls of the two junction boxes 14a and 14b such that the connectors 48(i) to 48(iv) are separated from one another in the lengthwise direction of the front side walls. Each of the connectors 48(i) to 48(iv) is provided with a connector housing 50 and a connection terminal 52 that is held by the connector housing 50 (see FIGS. 4 and 6). Each connector housing 50 has a substantially rectangular cross section and extends rearward (obliquely upward to the right in FIG. 5). Also, each connector housing 50 has a substantially rectangular tube shape with a bottom, and is open forward (obliquely downward to the left in FIG. 5). In contrast, each connection terminal 52 substantially has a flat plate shape, and protrudes forward from a substantially central portion of a bottom wall 54 of the connector housing 50 so as to have a length that does not reach the opening. In FIG. 6, in order to facilitate understanding, the connector 48 and the housing body 12 are drawn with imaginary lines. Ribs 55a and recessed grooves 55b that extend in the axial direction are provided in predetermined areas of the four side walls of each connector housing 50 (see FIG. 4). In particular, recessed grooves 55b in the left and right side walls are asymmetrically positioned, so that the harness end connectors 60a to 60c (described later) are prevented from being incorrectly attached.

In the present embodiment, the first connector 48(i) of the junction box 14a, which is the connector provided closer to the junction box 14b, houses and positions a positive-side connection terminal 52a that is connected to the positive side of the battery module 33, whereas the third connector 48(iii) of the junction box 14a, which is the connector provided farther from the junction box 14b, houses and positions a positive-side connection terminal 52a that is connected to a low-voltage circuit. Also, the second connector 48(ii) of the junction box 14b, which is the connector provided closer to the junction box 14a, houses and positions a negative-side connection terminal 52b that is connected to the negative side of the battery module 33, whereas the fourth connector 48(iv) of the junction box 14b, which is the connector provided farther from the junction box 14a, houses and positions a negative-side connection terminal 52b that is connected to the negative side of the low-voltage circuit.

Figure 2:
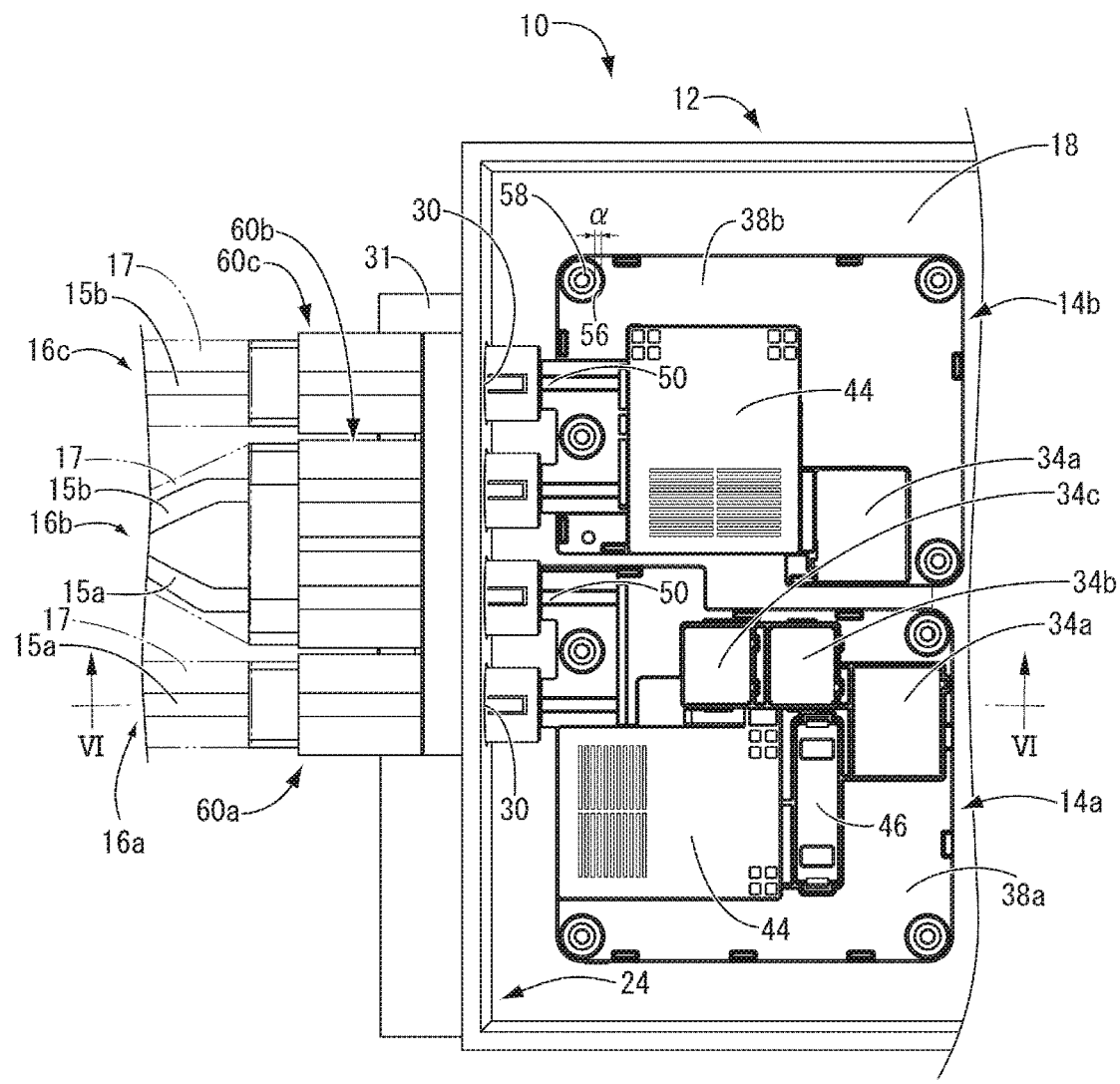
FIG. 2 is an enlarged plan view of portions of the circuit assemblies and a portion of the housing shown in FIG. 1.

Also, as shown in FIG. 2, the four corners of each of the resin cases 38a and 38b of the two junction boxes 14a and 14b are respectively provided with positioning cavities 56 for positioning the junction box 14a or 14b relative to the housing body 12. Each of the positioning cavities 56 has a substantially circular hole shape and penetrates through the resin case 38a or 38b in a top-bottom direction. When the junction boxes 14a and 14b are to be placed in the housing body 12, positioning protrusions 58 that protrude from appropriate positions of a bottom wall 18 of the housing body 12, and that each have a substantially cylindrical shape, are inserted into the positioning cavities 56 respectively provided at positions corresponding thereto, and thus the junction boxes 14a and 14b are positioned relative to the housing body 12. In this way, according to the present embodiment, the positioning protrusions 58 provided on the bottom wall 18 of the housing body 12 and the positioning cavities 56 provided in the junction boxes 14a and 14b are fitted to each other, and thus mechanisms for positioning the housing body 12 and the junction boxes 14a and 14b are formed. Here, a dimensional tolerance a (see FIG. 2) regarding the length of a gap between the respective surfaces of a positioning cavity 56 and a positioning protrusion 58 that face each other has been determined considering a manufacturing tolerance or the like.

When the junction boxes 14a and 14b are positioned and fixed to the housing body 12 in this way, the connectors 48 of the junction boxes 14a and 14b are, as shown in FIG. 3, housed and positioned in the housing so as to face the through holes 30 in the housing body 12 with a gap ß therebetween (see FIG. 3). Also, as shown in FIG. 2, the harness end connectors 60a, 60b, and 60c provided at the ends of the wire harnesses 16 are inserted into the through holes 30 provided in the housing body 12, and are respectively connected to the connectors 48 (iii), 48(i) and 48(ii), and 48(iv) provided in the junction boxes 14a and 14b. The harness end connectors 60a to 60c are respectively provided with the connector housings 62a to 62c and electrical wire-side connection terminals 64 that are held by the connector housings 62a to 62c. Here, the harness end connector 60a and the harness end connector 60c have basically the same configuration, and the harness end connector 60b has basically the same configuration except that the harness end connector 60b is integrated with a connector housing that houses two electrical wire-side connection terminals 64 respectively connected to the positive-side electrical wire 15*a* and the negative-side electrical wire 15*b*. Therefore, the following describes the harness end connector 60*a* as an example.

As shown in FIG. 6, the connector housing 62*a* of the harness end connector 60*a* includes: a housing body 66 that has a substantially cylindrical shape that is open in the axial direction (in the left-right direction in FIG. 6); a housing movable portion 68 that is attached to a leading end-side portion (on the right side in FIG. 6) of the housing body 66; a body holding portion 70 that holds a base end-side portion (on the left side in FIG. 6) of the housing body 66 inserted thereinto; and a cap member 72, which will be described later. A central portion of the housing body 66 in the axial direction is provided with a work hole 69 for coupling and fixing connection portions 96 and 98 of a first press-fit terminal 88 and a second press-fit terminal 90 (described later) using a bolt 100. The first press-fit terminal 88 and the second press-fit terminal 90 constitute an electrical wire-side connection terminal 64. The work hole 69 is to be covered by a lid member that substantially has a n shape cross section, after work has been completed. Also, a seal member 71 that is made of rubber and has a substantially trapezoidal cross section is provided on the outer circumferential surface of the housing body 66 at a position that is slightly closer to the leading end than the work hole 69 is, so as to extend along the entire circumferential surface. Here, the seal member 71 is fixed at a predetermined position, using the cap member 72 that has a substantially cylindrical shape and is fitted onto a leading end-side portion of the outer circumferential surface of the housing body 66. Thus, the outer circumferential surface of the housing body 66 is press-fitted to an inner circumferential edge portion of the through hole 30 in the housing body 12 with the seal member 71 therebetween. Therefore, it is possible to prevent water or the like from entering the housing body 12 through the wire harnesses 16*a* to 16*c*. Also, it is possible to prevent an abnormal noise from being caused by the through hole 30 and the harness end connector 60*a* from directly abutting against each other.

The housing movable portion 68 includes a base end portion 74 (on the left side in FIG. 6) that has a large diameter, and a leading end portion 76 that has a smaller diameter than the base end portion 74. The housing movable portion 68 has a stepped cylindrical shape that is open in the axial direction. The base end portion 74 of the housing movable portion 68 is inserted into the leading end-side opening of the housing body 66 with a predetermined gap y therebetween in a radial direction (see FIG. 6). That is, the outer diameter of the base end portion 74 of the housing movable portion 68 is smaller than the inner diameter of the leading end-side opening of the housing body 66 due to the gap y. Thus, the housing movable portion 68 can be displaced in a radial direction relative to the housing body 66. Note that the housing movable portion 68 is prevented from being detached from the leading end-side of the housing body 66 due to the housing movable portion 68 abutting against an inner flange portion 78 that extends inward in a radial direction from the leading end portion (on the right side in FIG. 6) of the cap member 72. The cap member 72 may be fixed to the housing body 66 by, for example, locking a lock claw 82, which may be provided on the cap member 72, to a lock hole 80, which may be provided in the leading end portion of the housing body 66. The inner diameter of the inner flange portion 78 is larger than the outer diameter of the leading end portion of the housing movable portion 68 due to the gap y, and thus the housing movable portion 68 is not prevented from being displaced in a radial direction relative to the housing body 66.

The leading end portion 76 of the housing movable portion 68 has a substantially rectangular tube shape, and ribs 84*a* and recessed grooves 84*b* are formed on/in the four outer surfaces of the leading end portion 76 so as to correspond in shape to the four side walls of a connector housing 50 of the junction boxes 14*a* and 14*b*. That is, the cross-sectional shape of the outer circumferential surface of the leading end portion 76 of the housing movable portion 68 is similar to, but is smaller than the cross sectional shape of the inner circumferential surface of the connector housing 50 in terms of their diameters, due to the gap y that constitutes the difference between the radius of the housing body 66 and the radius of the housing movable portion 68. A rib 55*a* and a recessed groove 84*b*, and a rib 84*a* and a recessed groove 55*b*, are fitted to each other with a gap therebetween, and thus the housing movable portion 68 is positioned in the circumferential direction so as to be displaceable relative to the connector housing 50, and directions in which the housing movable portion 68 can be displaced are limited to the top-bottom direction and the left-right direction, which are two directions orthogonal to the axial direction that is the direction in which the connection terminal 52 extends. Also, the lower side wall of the leading end portion 76 of the housing movable portion 68 is provided with a lock claw 87 that is fitted into a lock hole 86 that is provided in a third press-fit terminal 93, which will be described later.

The body holding portion 70 of the connector housing 50 substantially has a hollow cylinder shape, and a base end-side portion thereof (on the left side in FIG. 6) has a slightly smaller diameter. The body holding portion 70 is attached to the outer surface of a base end-side portion (on the left side in FIG. 6) of the housing body 66. A leading end-side portion of the body holding portion 70 is provided with a fixing protrusion 91 that has a substantially L-shaped cross section and extends rearward (to the right in FIG. 6). A fixing hole 92 penetrates through the fixing protrusion 91. When the harness end connector 60*a* is inserted into a through hole 30 in the housing body 12 and is attached to a connector 48 of the junction box 14*a*, the harness end connector fixing portion 31 of the housing body 12 and the fixing protrusion 91 provided below the harness end connector fixing portion 31 can be fastened to each other, using a bolt and a nut, for example, through the fixing holes 32 and 92. Note that a clip ring 85 is press-fitted onto the base end-side portion, which has a slightly smaller diameter, of the body holding portion 70.

As shown in FIG. 6, the electrical wire-side connection terminal 64 of the harness end connector 60*a* includes: the first press-fit terminal 88 to which the positive-side electrical wire 15*a* of the wire harness 16*a* is press-fitted; the second press-fit terminal 90 to which one end of a flexible conductor 89 is press fitted; and the third press-fit terminal 93 to which the other end of the flexible conductor 89 is press fitted, which are arranged in this order from the base end side (the left side in FIG. 6) to the leading end side (the right side in FIG. 6) in the axial direction (the left-right direction in FIG. 6). Note that the flexible conductor 89 is constituted by a well-known member such as a braided wire. The first press-fit terminal 88 is housed in a base end-side portion of the housing body 66, and the outer circumferential surface of the positive-side electrical wire 15*a* that is press-fitted and connected to the first press-fit terminal 88 is provided with a seal member 94 that is made of rubber, that has a substantially rectangular cross section, and that extends along the entire circumference. The seal member 94 is fixed to a predetermined area of the outer circumferential surface of the wire harness 16a, using a cap member 95 that is substantially ring-shaped and is attached to the base end-side (the left side in FIG. 6) of the seal member 94. Thus, the outer circumferential surface of the positive-side electrical wire 15a is press-fitted to the inner circumferential surface of the housing body 66 with the seal member 94 therebetween. The second press-fit terminal 90 is housed in a central portion of the housing body 66, and the connection portion 96 of the first press-fit terminal 88 and the connection portion 98 of the second press-fit terminal 90 are coupled and connected to each other in the work hole 69, using the bolt 100. Thus, the first press-fit terminal 88 and the second press-fit terminal 90 are electrically connected to each other, and the second press-fit terminal 90 and the third press-fit terminal 93 are electrically connected to each other via the flexible conductor 89. The flexible conductor 89 is housed in a lead-end side portion of the housing body 66, and the third press-fit terminal 93 is provided so as to protrude from the leading end of the housing body 66. The base end portion 74 of the housing movable portion 68 encloses the respective press-fitted portions of the flexible conductor 89 and the third press-fit terminal 93, and a connection portion 102 of the third press-fit terminal 93 is housed in the leading end portion 76 of the housing movable portion 68 and is locked thereto. Note that the connection portion 102 of the third press-fit terminal 93 includes an elastic contact piece 104 and an embossed portion 106, between which the connection terminal 52 of the connector 48 of the junction box 14a is sandwiched so that electrical conduction is established.

As described above, in each of the harness end connectors 60a to 60c with such a configuration, the electrical wire-side connection terminal 64 and the housing movable portion 68 enclosing it are displaceable in a radial direction relative to the housing body 66 that constitutes the connector housing 62a, 62b, or 62c, and thus the electrical wire-side connection terminal 64 and the housing movable portion 68 have a floating structure that is held so as to be displaceable relative to the housing body 66. Also, the diameter of the outer circumferential surface of the leading end portion 76 of the housing movable portion 68 of each of the harness end connectors 60a to 60c is smaller than the diameter of the inner circumferential surface of the connector housing 50 of each of the connectors 48(i) to 48(iv) provided in the junction boxes 14a and 14b by a length corresponding to the gap y. Thus, even if the positions of the junction boxes 14a and 14b in the housing body 12 vary within a tolerance, the floating structures can absorb such displacement. Therefore, even if dimensional tolerances accumulate as in the structure according to the present embodiment in which the harness end connectors 60a to 60c are connected to the connectors 48(i) to 48(iv) of the junction boxes 14a and 14b provided in the housing body 12, it is possible to advantageously mitigate or eliminate the risk of the positioning of the connectors being difficult. In addition, it is also possible to reduce the dimensional tolerance a (see FIG. 2) regarding the length of the gap between the respective surfaces of the positioning protrusion 58 and the positioning cavity 56 that face each other, within the range of the length of the gap y, which is the length of displacement of the electrical wire-side connection terminal 64 employing the above-described floating structure, relative to the housing body 66, thus it is possible to reduce the degree of variation within the dimensional tolerance.

In the wire harness connecting structure 10 for housed circuit assemblies according to the present embodiment with such a configuration, the connectors 48(i) to 48(iv) are provided in the junction boxes 14a and 14b housed in the housing body 12, and the connectors 48(i) to 48(iv) are provided so as to face the through holes 30 in the housing body 12, with a gap therebetween. Furthermore, the harness end connectors 60a to 60c provided at the ends of the wire harnesses 16a to 16c are configured to be inserted into the through holes 30 provided in the housing body 12 and to be directly connected to the connectors 48(i) to 48(iv) provided in the junction boxes 14a and 14b. Thus, it is possible to eliminate the need for parts that are necessary for a conventional structure, namely, a housing connector provided on a wall of a housing, and a wire harness and a bus bar that electrically connect the housing connector and a junction box to each other. Therefore, it is possible to reduce the number of parts such as housing connectors and wire harnesses, and accordingly reduce the number of work steps. Also, it is possible to save space that is needed to connect the junction boxes and the wire harnesses to each other.

The housing body 12 is a metal body formed through die-casting using an aluminum alloy, for example, and the two junction boxes 14a and 14b, which constitute circuit assemblies, and the battery module 33, are housed in the housing body 12. Thus, it is possible to shorten high-voltage electrical wires that connect the junction boxes 14a and 14b and the battery module 33 to each other, and mitigate or solve the problem of noise.

Although an embodiment of the present disclosure has been described above, the present disclosure is not limited to any specific description of the embodiment. For example, in the embodiment above, the electrical wire-side connection terminals 64 of the harness end connectors 60a and 60b have a floating structure that is held so as to be displaceable relative to the housing body 66. However, the connection terminals 52 of the connectors 48(i) to 48(iv) may have a floating structure that is held so as to be displaceable relative to the connector housings 62a and 62b, or both may have a floating structure. In the embodiment above, the positioning protrusions 58 are provided on the housing body 12 and the positioning cavities 56 are provided in the junction boxes 14a and 14b. However, they are interchangeable. Furthermore, the present disclosure is also applicable when connecting a wire harness to a circuit assembly in a housing of various types as well as in the battery pack 36 described as an example.

What is claimed is:

1. A wire harness connecting structure for a housed circuit assembly, the structure being used to electrically connect a wire harness to a circuit assembly; the wire harness connecting structure comprising:

a housing configured to housing the circuit assembly, the housing having a wall bounding the circuit assembly so as to define an interior space, the wall including a through hole, a circuit assembly connector that is provided in the circuit assembly and disposed within the interior space, the circuit assembly connector facing the through hole, and a harness end connector that is provided at an end of the wire harness is configured to be inserted into the through hole of the circuit assembly housing, wherein a portion of the harness end connector is disposed within the interior space, the portion of the harness end connector is connected to the circuit assembly connector of the circuit assembly, wherein the circuit assembly connector and the harness end connector are each provided with a connector housing and a connection terminal that is held by the connector housing, and at least one of the circuit assembly connector and the harness end connector has a floating structure in which the connection terminal and a housing movable portion that encloses the connection terminal are held so as to be displaceable relative to a body of the connector housing.

2. The wire harness connecting structure for a housed circuit assembly according to claim 1, wherein a positioning mechanism is provided between respective surfaces that face each other of the circuit assembly housing and the circuit assembly, the positioning mechanism including a positioning protrusion and a positioning cavity that are configured to be fitted to each other, the positioning protrusion being provided on one of the circuit assembly housing and the circuit assembly, the positioning cavity being provided in the other of the circuit assembly housing and the circuit assembly, and a dimensional tolerance regarding a gap between respective surfaces that face each other of the positioning protrusion and the positioning cavity is smaller than the length of displacement of the connection terminal in the floating structure, relative to the connector housing.

3. The wire harness connecting structure for a housed circuit assembly according to claim 1, wherein the circuit assembly housing is made of metal, the circuit assembly constitutes a junction box that is configured to switch to a connected state and to a disconnected state using a relay circuit, and the junction box and a battery module that is connected to the junction box are housed in the circuit assembly housing and thus a battery pack is formed.

4. The wire harness connecting structure for a housed circuit assembly according to claim 1, wherein the outer circumferential surface of the connector housing of the harness end connector of the wire harness is configured to be press-fitted to an inner circumferential edge portion of the through hole of the circuit assembly housing with a seal member therebetween.

5. The wire harness connecting structure for a housed circuit assembly according to claim 2, wherein the circuit assembly housing is made of metal, the circuit assembly constitutes a junction box that is configured to switch to a connected state and to a disconnected state using a relay circuit, and the junction box and a battery module that is connected to the junction box are housed in the circuit assembly housing and thus a battery pack is formed.

6. The wire harness connecting structure for a housed circuit assembly according to claim 2, wherein the outer circumferential surface of the connector housing of the harness end connector of the wire harness is configured to be press-fitted to an inner circumferential edge portion of the through hole of the circuit assembly housing with a seal member therebetween.

7. The wire harness connecting structure for a housed circuit assembly according to claim 3, wherein the outer circumferential surface of the connector housing of the harness end connector of the wire harness is configured to be press-fitted to an inner circumferential edge portion of the through hole of the circuit assembly housing with a seal member therebetween.

* * * * *